United States Patent [19]

Schwarz et al.

[11] Patent Number: 4,844,009

[45] Date of Patent: Jul. 4, 1989

[54] APPARATUS FOR COATING WEBS OF MATERIAL HAVING AN OPEN STRUCTURE IN DEPTH

[75] Inventors: Wolfgang Schwarz, Linsengericht; Bernhard Herkert, Karlstein; Hans Kessler, Hanau, all of Fed. Rep. of Germany

[73] Assignee: Leybold Aktiengesellschaft, Hanau am Main, Fed. Rep. of Germany

[21] Appl. No.: 297,147

[22] Filed: Jan. 13, 1989

Related U.S. Application Data

[62] Division of Ser. No. 156,722, Feb. 17, 1988, Pat. No. 4,826,707.

[30] Foreign Application Priority Data

Nov. 28, 1987 [DE] Fed. Rep. of Germany ....... 3740483

[51] Int. Cl.$^4$ ............................................... C23C 14/00
[52] U.S. Cl. .................................... 118/718; 118/724
[58] Field of Search .............................. 118/718, 724

[56] References Cited

U.S. PATENT DOCUMENTS 3,498,259 3/1970 Braguier ............................... 118/718
4,423,956 1/1984 Gordon ................................ 118/718

FOREIGN PATENT DOCUMENTS 1059739 6/1959 Fed. Rep. of Germany .

Primary Examiner—Richard Bueker
Attorney, Agent, or Firm—Felfe & Lynch

[57] ABSTRACT

A method and apparatus for vacuum coating of materials having a three-dimensional surface structure is disclosed that provides cooling, to prevent heat destruction of those materials during vacuum coating. The web is moved back and forth across the coating area, between rolls. A cooling film is rolled onto each roll with the web. As the web is unrolled, the film is unrolled and recooled before being rolled up again with the web.

5 Claims, 1 Drawing Sheet

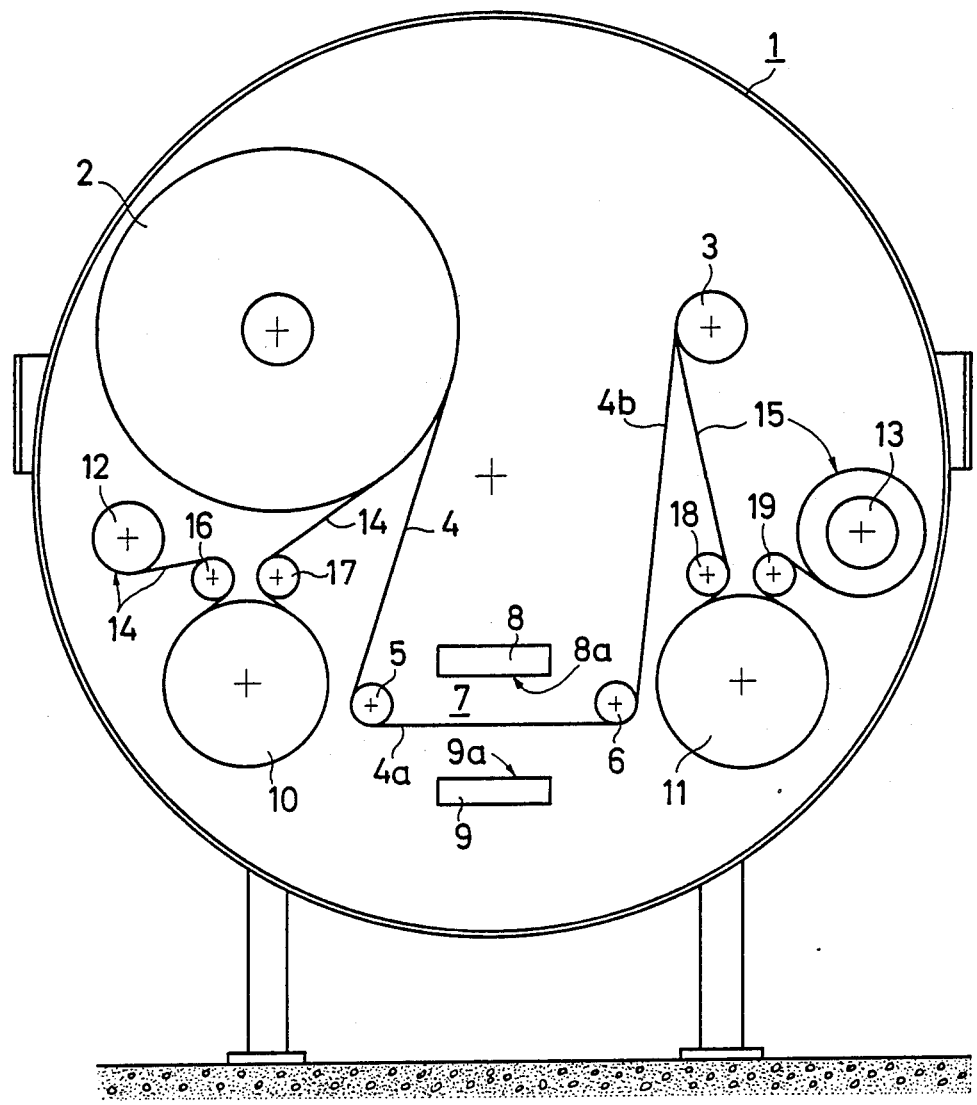

APPARATUS FOR COATING WEBS OF MATERIAL HAVING AN OPEN STRUCTURE IN DEPTH

This is a divisional application of U.S. Ser. No. 156,722, filed Feb. 17, 1988, now U.S. Pat. No. 4,826,707.

BACKGROUND OF THE INVENTION

1. Field of the Invention

The invention relates to apparatus for the vacuum coating of webs having a three-dimensional surface structure.

The apparatus includes a vacuum chamber having two rolls for unwinding and winding the web material, a coating source disposed between the rolls in the path of the web material, and at least one reserve roll with a cooling film.

2. Discussion of Related Art

DE-AS No. 1 059 739 discloses a method in vacuum coating whereby heat-sensitive bands are passed through the coating zone on an accompanying cooling film and winding this cooling film, together with the bands in some cases to prevent the individual layers of the bands from sticking to one another. In this manner, however, coating on two sides is possible only by separating the tape and cooling film and then turning the band. The known method, however, is not sufficient when webs having an open structure in depth are involved, such as foams, nonwovens, fabrics etc., are to be coated with a relatively great amount of the coating material per unit of area.

In the case of vacuum coating by a physical deposition process such as vapor depositing and cathode sputtering, the substrate (the web of material) is subjected to great thermal stress, due to the unavoidable thermal radiation and to the heat of condensation that is released by the deposition. Since in the vacuum it is impossible to cool with gases or ambient air, the substrate is generally guided within the coating zone over a cooled surface, which is also described in DE-AS No. 1 059 739. This measure, however, promises to be successful only if the substrate has a good thermal conductivity and/or a slight thickness, and lies smoothly against the cooling surface, which is true to some extent for thin plastic films.

The circumstances are quite different in the case of materials with three-dimensional surface structure, i.e., in the case of foams, nonwovens, fabrics etc., which have pores, cavities, projecting surface particles etc., which cannot be laid smoothly against cooling surfaces, and which as a rule are poor thermal conductors and have a relatively great thickness. The coating material condenses preferentially on projecting particles of the irregular surface, where it yields its condensation heat in addition to the radiant heat. Removal of heat to the side and through the back of the substrate is negligible. The consequence is a rapid destruction of the substrate, even at low rates of deposition per unit area of the substrate. Conditions are still more unfavorable when the material is coated simultaneously from both sides, since in this case the thermal stress is doubled and no cooling can be performed in the coating zone.

Any attempt to divide the material into several batches and apply it to the web in a number of successive passes has also failed, since the roll of the material web is an ideal heat accumulator, so that the substrate temperature rose accumulatively in each pass and the substrate was destroyed in the second, or certainly at least in the third pass.

SUMMARY OF THE INVENTION

The invention is therefore addressed to the problem of providing a coating method and a coating apparatus of the kind described above, by which webs of material with an open structure in depth (three dimensional surface) can be coated without thermal damage.

In the inventive apparatus, the two rolls for winding and unwinding the web material are provided with a reversing drive, and a cooling system is associated with the reserve roll for recooling the cooling film.

By the movement back and forth of the material web, in an oscillatory operation, so to speak, combined with the rolling up each time of the repeatedly recooled cooling film, the establishment of a temperature intermediate between material web temperature and cooling film temperature, the "outwinding" of the heated cooling film, and the transfer of the heat by means of the cooling film to a heat transfer agent, it becomes possible to eliminate the build-up of heat in the material web and in the roll, so that the total amount of coating material to be applied to a corresponding number of portions per unit area can be divided up, and the number of passes or coating procedures can be increased virtually at will, with a correspondingly reduced temperature rise per individual pass.

With the method of the invention it is possible to coat the material web in both directions of movement, and even on both sides simultaneously, without unacceptable temperature increase, thereby increasing accordingly the capacity of the apparatus and hence the economy of operation.

BRIEF DESCRIPTION OF THE DRAWING

The sole FIGURE shows a vertical section through the apparatus.

DESCRIPTION OF A PREFERRED EMBODIMENT

In a cylindrical vacuum chamber 1 are two rolls 2 and 3 which serve alternately as winding and unwinding rolls according to the direction in which the web of material 4 is running. The larger coil is, in the instant illustrated, on the left, first roll 2 (unwinding roll), while the second roll 3 serves as the winding roll. Between these two rolls lies the course of the material web 4. Since the coil diameter of both coils constantly changes, a freely outstretched portion 4a of the material web is in a fixed position between two pulleys 5 and 6. In this portion 4a lies the coating zone 7 which is formed by two coating sources 8 and 9 which are in the form of magnetron cathodes known in themselves, whose sputtering surfaces 8a and 9a are facing one another and in mirror-image symmetry with the portion 4a.

Underneath the rolls 2 and 3 are two cooling systems 10 and 11 in the form of rotatable cooling cylinders, and one take-up roll 12 and 13, respectively, is associated with each. The cooling cylinders are held at temperatures of −20° C. by a circulating liquid. The coils on the rolls 2 and 3 consist of alternating layers of the material web and cooling films 14 and 15, respectively.

On the coil on roll 2 the cooling film is unwound at the same running speed as the material web 4 and wound onto the take-up roll 12 after having passed over the circumference of the cooling system 10. The wraparound angle on the cooling roll is kept as great as possible by two pulleys 16 and 17.

The additional cooling film 15 is unwound from the take-up roll 13 and guided over the similar cooling system 11 with which two idlers 18 and 19 are associated. From the idler 18 the cooling film 15 runs at the same velocity as the material web into the gap between the free-running section 4b of the material web 4 and the already-formed coil of roll 3, so that the same coil of material web and cooling film is formed on the latter as on the roll 2. The winding is continued until virtually all of the lengths of the material web 4 are on the roll 3 and those of the cooling film 14 are on the take-up roll 12.

In this instant virtually the entire length of the cooling film 15 is within the coil on the roll 3. The delivery of heat to the web of material previously was performed continuously in the coating zone 7 by the simultaneously acting coating sources 8 and 9, and on the roll 3 a temperature is established which is intermediate between the temperatures of the material web and of the cooling film according to the thickness ratios and the specific heat of the materials.

After that the direction of movement of the material web 4 and of the cooling films 14 and 15 is reversed by appropriate reversing drives: the heated cooling film 15 runs on the cooling roll 11, yielding its heat to the latter, and across the latter to the take-up roll 13 where it is held for the next pass. At the same time the cooling film 14 runs from the idler 17 into the gap between the material web 4 and the coil already formed on the roll 2, so that here too an alternating order of individual layers of material web and cooling film is formed, and a corresponding intermediate temperature is established. The entire process runs in the reverse direction until virtually all of the lengths of the material web 4 and of cooling film 14 are on the roll 2.

This alternating process can be repeated as often as desired until the given amount of coating material (such as a metal or an alloy) has been deposited per unit area on the material web. The material of the cooling film can be metal or plastic (polyester, polyethylene, polypropylene etc.) of the highest possible heat retaining capacity.

EXAMPLE 1 (FOR PURPOSE OF COMPARISON)

In an apparatus according to the drawing, but without cooling films, 250 meters of a material web 100 cm wide and 2 mm thick made of a fine, open-pore plastic foam that is initially at room temperature is wound at a running speed of 25 m/min and coated on both sides with a metal having a melting temperature of more than 1500° C. The coating rate was selected such that, at the given running speed or time of stay, a material web temperature of 120° C. established itself on the roll 3. The attempt to reverse the direction of movement had to be halted immediately on account of the destruction of the material web in the second coating process.

EXAMPLE 2

The attempt according to Example 1 was repeated, but this time with the two cooling films 14 and 15. The cooling films, which were of the same length and width as the material web, consisted of a thermoplastic with a thickness of 0.2 mm and, after leaving the cooling rolls, had a temperature of about $-10°$ C. From this an intermediate temperature of about 30° C. resulted on the roll 3 after the first pass. After the reversal of direction and the second coating process, a material web temperature of 125° C. developed before it was joined to the cooling film, but on the roll 2 the web had an intermediate temperature of about 32° C. A total of 8 runs of about 10 minutes each were performed in alternation, until the necessary amount of metal had been deposited on both sides of the web in each pass, but the material web did not assume an unacceptably high temperature.

We claim:

1. Apparatus for vacuum coating webs that have a three-dimensional surface structure, said apparatus comprising:
   a vacuum chamber containing means for coating a web;
   two rolls having a reversing drive adapted to unwind and wind the web;
   at least one coating source disposed in the path of the web between said rolls;
   at least one reverse roll adapted to wind a cooling film; and
   cooling means associated with said reverse roll to recool said cooling film.

2. Apparatus according to claim 1 wherein the reverse roll has a reversing drive.

3. Apparatus according to claim 2, characterized in that a cooling roll (10 and 11) is disposed in the path of movement of the cooling film (14 and 15, respectively) to the reserve roll (12 and 13, respectively), and the cooling film is carried over it.

4. Apparatus according to claim 1, characterized in that the material web (4) is freely suspended in the coating zone (7).

5. Apparatus according to claim 3, characterized in that on both sides of the coating zone (7) two reserve rolls (12, 13) and two cooling rolls (10, 11) are disposed.

* * * * *